United States Patent [19]

Ruijs

[11] Patent Number: 4,972,106

[45] Date of Patent: Nov. 20, 1990

[54] BINARY-TO-TERNARY CONVERTER FOR COMBINING TWO BINARY SIGNALS

[75] Inventor: Jan B. F. W. Ruijs, Hilversum, Netherlands

[73] Assignee: AT&T Bell Laboratories, Murray Hill, N.J.

[21] Appl. No.: 326,184

[22] Filed: Mar. 17, 1989

[30] Foreign Application Priority Data

Mar. 24, 1988 [NL] Netherlands .......... 8800741

[51] Int. Cl.$^5$ .......... H03K 19/00; H03M 5/16
[52] U.S. Cl. .......... 307/473; 307/475; 307/456; 307/261; 341/57
[58] Field of Search .......... 307/473, 475, 456, 457, 307/261; 341/56, 57

[56] References Cited

U.S. PATENT DOCUMENTS

| | | | |
|---|---|---|---|
| 3,217,316 | 11/1965 | Trampel | 341/57 |
| 3,337,862 | 8/1967 | Croft et al. | 341/56 |
| 3,492,496 | 1/1970 | Callan | 307/473 |
| 3,660,678 | 5/1972 | Maley et al. | 307/473 |
| 4,345,164 | 8/1982 | Gies | 307/473 |

FOREIGN PATENT DOCUMENTS 0292415 12/1986 Japan .......... 307/473

Primary Examiner—Timothy P. Callahan
Attorney, Agent, or Firm—Lucian C. Canepa

[57] ABSTRACT

A binary-to-ternary converter arrangement which achieves protective resistance against high outside voltages without having to compromise the voltage level of the positive and negative output ternary pulses. In so achieving, the minimum amplitude requirement of a CCITT recommendation of an output pulse for a given supply voltage is satisfied. This converter arrangement includes a parallel circuit of first and second series circuits. The first series circuit forms a main current path of two transistors and the second series circuit forms a current path of a diode, two resistors, and a third transistor. The different elements of these two circuits, along with a capacitor element, are interconnected in such a way as to eliminate the need for the use of a transformer altogether. The control electrodes of the first and second transistors serve as input ports and the junction port of the two resistors serves as the output port.

2 Claims, 1 Drawing Sheet

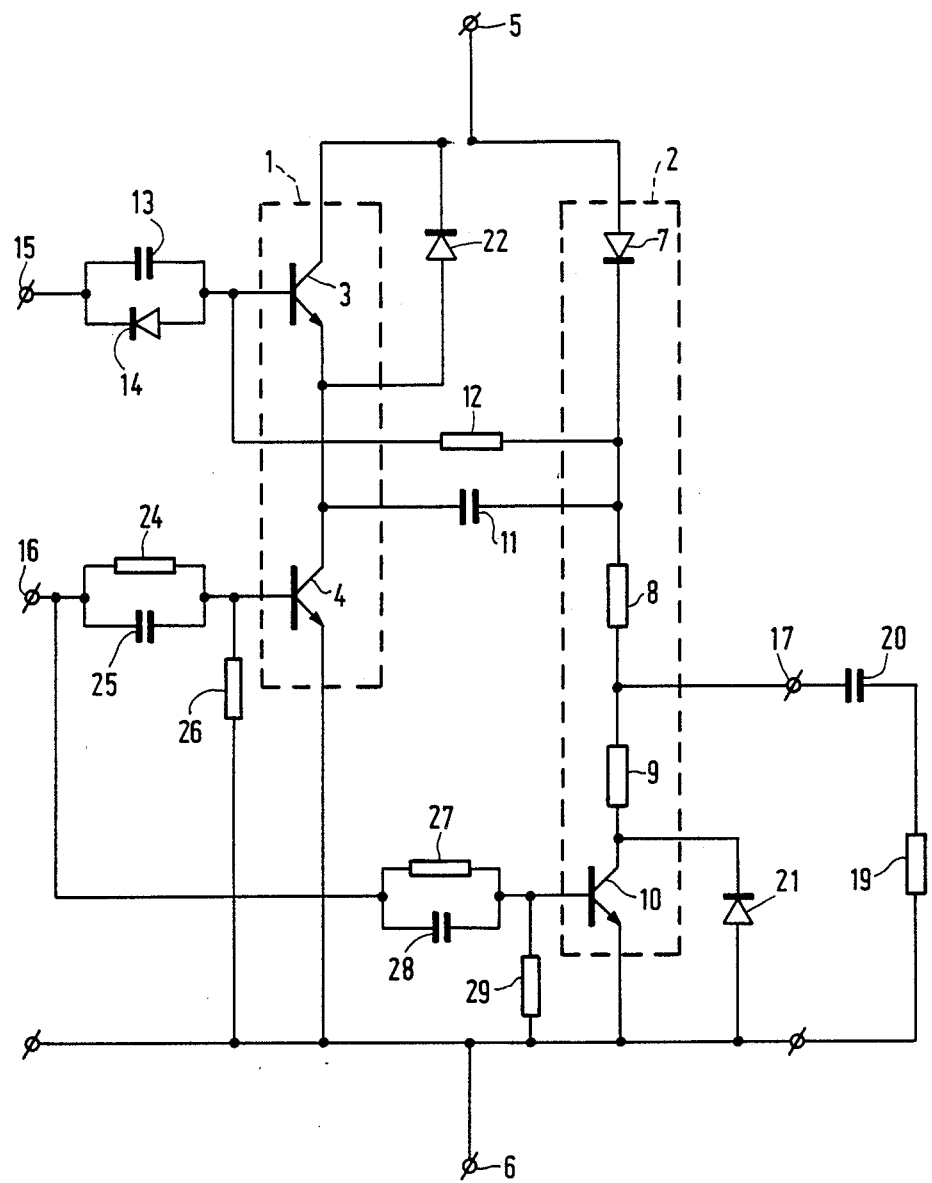

BINARY-TO-TERNARY CONVERTER FOR COMBINING TWO BINARY SIGNALS

BACKGROUND OF THE INVENTION

The invention relates to a binary-to-ternary converter for combining two binary signals into one ternary signal.

Such a binary-to-ternary converter is known from the German Patent Application No. 34 02 257, published Aug. 1, 1985. The binary-to-ternary converter disclosed therein comprises an electronic circuit having two inputs and an output transformer. In the Figure incorporated in this Patent Application the input for a first binary signal is referenced $A_1$ and the input for a second binary signal is referenced $A_2$. The secondary winding of the output transformer forms the output port of this binary-to-ternary converter. A positive pulse on input port $A_1$ causes a positive output pulse on the output port. A positive pulse on input port $A_2$ causes a negative output pulse on the output port. This known circuit thus combines two binary signals into one ternary signal.

Since transformers have disadvantages known to those skilled in the art, such as being relatively large and heavy, not being integrable and causing stray fields, transformers in electronic circuits are less desired.

When the output signal of a binary-to-ternary converter is transported via a long conductor, this binary-to-ternary converter should be resistant to overvoltages from outside. By serially connecting to the output port of the binary-to-ternary converter a protective resistance having a sufficiently high resistance value, in combination with a voltage-limiting means arranged at an appropriate location, sufficient protection is obtained. A practically suitable resistance value for this protective resistance is larger than 10 ohms.

Owing to the voltage loss through this protective resistance, the amplitude of the voltage of the output pulses is reduced. Even at the lowest resistance value of 10 ohms and a 75-ohm preset test load connected to the output and serially connected to the protective resistance, the amplitude of the voltage across the load is reduced by approximately 12%. As the protective resistance has a higher resistance value, which is generally desirable, so is the amplitude of the voltage across the load reduced further. With a like test load of 75 ohms and a protective resistance of 22 ohms, this amplitude is reduced by approximately 23%.

According to the CCITT Recommendation G703, a pulse of the ternary output signal at the output port shall have a voltage amplitude of 2.37 V±10%. The minimum voltage amplitude is then 2.13 V, the maximum voltage amplitude 2.61 V.

In the binary-to-ternary converter known from the said German Patent Application No. 34 02 257 this minimum required amplitude is simple to realize, even if a protective resistance were serially connected to the output port. For, the voltage at the output port of this binary-to-ternary converter can be simply increased by increasing the number of windings on the secondary side of the output transformer. Serially connecting a protective resistor to the output port, causing a voltage loss, does not pose a problem with this binary-to-ternary converter.

When using a supply voltage of 5 V±5% (as standardized for TTL logic, for example) a minimum supply voltage of 5 V−5%=4.75 V is to be taken into account. In this case, half the 4.75 V, thus 2.37 V remains for an output pulse of a ternary signal from a binary-to-ternary converter. If a protective resistance of 10 ohms (thus the lowest conceivable value) is serially connected to the output port of a binary-to-ternary converter, this resistor will cause, as calculated hereinbefore, a voltage loss of approximately 12% across a load having a 75-ohm resistance value. In that case there will remain 2.37 V−12%=2.09 V for the output pulse. The CCITT Recommendation G703, prescribing a minimum voltage amplitude of 2.13 V of the pulse at the output port, is then no longer satisfied. In practice 22 ohm protective resistors will rather be used. They cause a voltage loss of approximately 23%, as a result of which the voltage amplitude of a pulse at the output port is reduced even further. In this case the amplitude requirement of the CCITT Recommendation G703 is still further deviated from.

Under unfavourable operating conditions, the said known binary-to-ternary converter without a transformer is unable to furnish output pulses having the minimum prescribed 2.13 V voltage amplitude when using a standard supply voltage of 5 V±5% and a protective resistance having a minimum resistance value of 10 ohms. In addition, the amplitude of these output pulses is even further reduced by the unavoidable voltage loss through the pulse shaping transistors at the output ports.

SUMMARY OF THE INVENTION

The invention has for its object to provide a binary-to-ternary converter without a transformer which supplies output pulses having a voltage amplitude of 2.37 V±10% to a load to be connected to the output and having a resistance value of 75 ohms, when a standard supply voltage of 5 V±5% is used as well as a protective resistance which has a sufficiently high resistance value and is serially connected to the output port of the binary-to-ternary converter.

For this purpose, the invention is characterized in that the binary-to-ternary converter comprises a parallel circuit of a first and a second series circuit, this parallel circuit comprising two supply terminals for the connection to a supply voltage, this first series circuit being formed by the main current path of a first and a second transistor, respectively, this second series circuit being formed by a diode, a first and a second resistor and the main current path of a third transistor, respectively, in the parallel circuit the junction of the diode and the first resistor being connected via a capacitor to the junction of the first and the second transistor, in the parallel circuit the control electrodes of the second and the third transistor being interconnected, in that the control electrodes of the first and the second transistor form the input ports to the binary-to-ternary converter, and in that the junction of the two resistors forms the output port of the binary-to-ternary converter.

The operation of this binary-to-ternary converter will be further explained with reference to the diagram of the binary-to-ternary converter according to the invention represented in the single FIGURE of the drawing herein.

DETAILED DESCRIPTION

The binary-to-ternary converter represented in the FIGURE comprises a parallel circuit of a first series circuit 1 and a second series circuit 2. The first series circuit 1 is formed by the main current path of a first NPN-transistor 3 and a second NPNH-transistor 4, respectively. The collector of transistor 3 is connected to the positive supply terminal 5. The emitter of transistor 3 is connected to the collector of transistor 4, whose emitter is connected to the negative supply terminal 6. The second series circuit 2 is formed by a diode 7, a first resistor 8, a second resistor 9 and the main current path of a third NPN-transistor 10, respectively. The anode of diode 7, as is the collector of transistor 3, is connected to the positive supply terminal 5. The cathode of diode 7 is connected to one side of the resistor 8. The other side of resistor 8 is connected to one side of resistor 9. The other side of resistor 9 is connected to the collector of transistor 10, whose emitter is connected to the negative supply terminal 6. The cathode of diode 7 is further connected to one side of a capacitor 11, whose other side is connected to the emitter of transistor 3. The cathode of diode 7 is also connected to one side of a third resistor 12, whose other side is connected to the base of transistor 3. This base is further connected on one side to a parallel circuit of a further capacitor 13 and a further diode 14. The other side of this parallel circuit forms the first input port 15 of the binary-to-ternary converter, whose second input port 16 is formed by one side of a parallel circuit comprising a resistor 24 and a capacitor 25. The other side is connected to the base of transistor 4 and via a resistor 26 to the negative supply terminal 6. Input port 16 is also connected to the parallel circuit of a resistor 27 and a capacitor 28. The other side of this parallel circuit is connected to the base of the transistor 10 and via a resistor 29 to the negative supply terminal 6. The output port 17 of the binary-to-ternary converter is formed by the junction of the resistors 8 and 9. The load having a resistance value of 75 ohms, represented by a resistor 19, is connected on one side via a coupling capacitor 20 to the output port 17. The other side of resistor 19 is connected to the negative supply terminal 6. The anodes of two further diodes 21 and 22 are connected to the emitters of the respective transistors 3 and 10 and the cathodes are connected to the collectors of these respective two transistors 3 and 10.

It should be observed that the resistors 12, 24, 26, 27, 29, the capacitors 13, 25, 28 and the diodes 14, 21 and 22 are not of essential importance for the functioning of the invention. The function of these components will be further explained hereinafter.

The input ports 15 and 16 are excited by signal sources (not shown) having an internal resistance of approximately 100 ohms. The negative sides of the signal sources are connected to the negative supply terminal 6. The two logic values (zero and one) correspond with nominal voltage levels of 0 and 5 V. The signal current during a pulse causes a voltage drop of approximately 0.3 V across an internal resistance of approximately 100 ohms. Consequently, the logic value "one" at an input port corresponds with approximately 4.7 V. The signal sources on average produce in time as many pulses at input port 15 as at input port 16 whilst, in addition, it is impossible that a pulse at input port 15 coincides with a pulse at input port 16. Furthermore, it is assumed that no more than two pulses consecutively occur at one input port without an intermediate pulse at the other input port.

For a proper functioning of the binary-to-ternary converter it is essential that first a number of pulses be applied to the input ports to bring the binary-to-ternary converter into the stationary condition. During this operation, capacitor 11 is charged to its mean value in the following way. A pulse at input port 16 appears at the base of transistor 4 and at the base of transistor 10 because the respective capacitors 25 and 28 completely conduct the voltage jump. The two transistors 4 and 10 reach saturation, because the resistors 24, 26, 27, 29 connected thereto have suitably chosen values. Owing to the two transistors 4 and 10 being saturated, the collector-emitter voltage is approximately 0.35 V. A current path develops from the positive supply terminal 5 through diode 7, capacitor 11 and the saturated transistor 4 to the negative supply terminal 6. Because approximately 0.5 V appears across diode 7 and approximately 0.35 V across the collector-emitter path of transistor 4, capacitor 11 is thus charged up to the available supply voltage of approximately 5 V minus 0.85 V (that is to say, 0.5 V ± 0.35 V). As long as pulses appear at input port 16 at regular intervals (alternated by pulses at input port 15), capacitor 11 remains charged up to this mean voltage.

If no pulses are presented to the input ports 15 and 16, all three transistors 3, 4 and 10 will be turned off, because the base voltage of each transistor will be too low with respect to the emitter voltage.

If no pulse is presented to either input port 15 or input port 16 there will be a current path from the positive supply terminal 5 through diode 7, resistor 12, diode 14 and the signal source connected to input port 15 towards the negative supply terminal 6. Because the value of the internal resistance of the signal source is much smaller than the value of resistor 12, there is approximately 0.5 V on the base of transistor 3. The voltage on the emitter of transistor 3 is approximately 0.35 V, because capacitor 11 is charged to its mean voltage. The base-emitter voltage is thus approximately 0.15 V and transistor 3 will be non-conductive. The base-emitter voltage of transistors 4 and 10 is 0 V. All three transistors 3, 4 and 10 are non-conductive now. There is 0 V across the resistor 19 connected to the output port 17 through the coupling capacitor 20, because coupling capacitor 20 is charged to its mean voltage, so that no current passes through this capacitor any longer.

A pulse on input port 15 (thus on the base of transistor 3) causes this transistor 3 to be conductive (because capacitor 13 completely conducts the voltage jump): the base voltage becomes approximately 5.2 V, because capacitor 13 completely conducts the 4.7 V voltage jump and because the base voltage of transistor 3 was approximately 0.5 V at the instant prior to the occurrence of the pulse. Now, transistor 3 is in the conductive state and, consequently, the base-emitter voltage is approximately 0.7 V; this causes the emitter voltage to rise to approximately 4.5 V during the pulse. The emitter voltage prior to the pulse was approximately 0.35 V and is thus increased by approximately 4.15 V. Capacitor 11 completely conducts this voltage jump. Consequently, diode 7 is cut off and because transistor 10 is cut off (no pulse on input port 16) and coupling capacitor 20 completely conducts the presented voltage jump, there is a 4.15 voltage jump through the resistors 8 and 19 which are serially connected for this pulse voltage. If the resistors 8 and 19 have the respective values of 56 and 75 ohms, a pulse on input port 15 will cause an output pulse through resistor 19 of 2.37 V, obtained as a result of a voltage division between the resistors 8 and 19. Consequently, the amplitude requirement of the CCITT Recommendation G703 (output pulse 2.37 V ± 10%) is satisfied.

A pulse on input port 16 appears on the bases of the transistors 4 and 10 because the capacitors 25 and 28 completely conduct the voltage jump. The two transistors 4 and 10 reach saturation because the resistors 24, 26, 27 and 29 have suitably chosen values. Since transistor 10 reaches saturation, its collector-emitter voltage drops to approximately 0.35 V. Consequently, also the voltage on output 17 will drop. Coupling capacitor 20 completely conducts this voltage drop and a negative output pulse develops through resistor 19. If the resistors 8, 9 and 19 have the respective values of 56, 22 and 75, ohms it can be calculated that the voltage on output port 17 will drop by approximately 2.46 V. Subsequently, a −2.46 V negative output pulse will develop across resistor 19. Hence the amplitude requirement of the CCITT Recommendation G703 is satisfied.

Hereinbefore it was observed that the resistor 12, capacitor 13 and diode 14 are not essentially important to the functioning of the invention. Owing to the combination of transistor 3 with diode 14 the circuit is less temperature dependent. If this reduction of the temperature dependence is of little importance, diode 14 and the associated resistor 12 and capacitor 13 can be omitted from the circuit. Without these components, the base of the transistor 3 forms the input port 15. If no pulse is presented to this input port 15, the base voltage will be 0 V because the aforementioned current path will no longer be available because of the omission of the three components, so that the 0.5 V voltage drop across diode 14 is absent. A 4.7 V pulse on input port 15 causes the base voltage of transistor 3 to rise to 4.7 V. Transistor 3 starts being conductive and because the base-emitter voltage cannot rise any further than approximately 0.7 V, the emitter voltage will rise to approximately 4.0 V. Because the emitter voltage was approximately 0.35 V prior to the occurrence of the pulse, the voltage drop is thus approximately 3.65 V. This voltage drop causes a positive pulse of approximately 2.34 V across resistor 19, if the value of resistor 8 is reduced to 42 ohms. Owing to this reduction of the value of resistor 8, it is possible to satisfy the amplitude requirement of the CCITT Recommendation G703, if the resistor 12, capacitor 13 and diode 14 are omitted.

The diodes 21 and 22 form the aforementioned voltage-limiting components for overvoltage protection. Such a component in combination with a protective resistance should be able to handle a high overvoltage pulse. A high positive overvoltage pulse on output port 17 through resistor 8 and the capacitor 11 completely conducting this pulse, causes diode 22 to be conductive; consequently, the overvoltage completely drops across resistor 8, safeguarding the rest of the circuit against overvoltage. A high negative overvoltage pulse on output port 17 causes diode 21 to be conductive through resistor 9, causing the overvoltage to drop across resistor 9. Thus, the binary-to-ternary converter is protected against high overvoltage pulses from outside.

The resistors 24, 26 and 27, 29 are used for protecting the respective transistors 4 and 10 by voltage division of the pulses present on input port 16. A pulse of approximately 5 V which is applied to a base of a transistor via an internal resistance of 100 ohms would otherwise cause a current that could damage this transistor.

The capacitors 25 and 28 completely conduct the voltage drops of the pulses present on input port 16. In addition, the two capacitors 25 and 28 make the respective (saturated) transistors 4 and 10 switch off at an earlier instant. Thus, these capacitors 25 and 28 improve the high-frequency behaviour of the circuit.

In the binary-to-ternary converter according to the FIGURE the following components have the following values:

| Type of component | number of component | value |
| --- | --- | --- |
| resistor | 8 | 56 ohms |
| resistor | 9 | 22 ohms |
| resistor | 12 | 3 kohms |
| resistor | 19 | 75 ohms |
| resistor | 24 | 1.5 kohms |
| resistor | 26 | 1.5 kohms |
| resistor | 27 | 1.5 kohms |
| resistor | 29 | 10 kohms |
| capacitor | 11 | 270 nF |
| capacitor | 13 | 47 nF |
| capacitor | 20 | 270 nF |
| capacitor | 25 | 22 nF |
| capacitor | 28 | 22 nF |

What is claimed is:

1. A binary-to-ternary converter for combining two binary signals into one ternary signal, characterized in that the binary-to-ternary converter comprises a parallel circuit of a first and a second series circuit, this parallel circuit comprising two supply terminals for connecting a supply voltage to said first and said second series circuits, said first series circuit being formed by the main current path of a first and a second transistor, respectively, said second series circuit being formed by a first diode, a first and a second resistor and the main current path of a third resistor, respectively, in the parallel circuit the junction of the first diode and the first resistor being connected via a first capacitor to the junction of the first and the second transistors, in the parallel circuit the control electrodes of the second and the third transistors being interconnected, in that the control electrodes of the first and the second transistors form the input ports to the binary-to-ternary converter, and in that the junction of the two resistors forms the output port of the binary-to-ternary converter.

2. A binary-to-ternary converter as claimed in claim 1, characterized in that the control electrode of the first transistor is connected to the junction of the first diode and the first resistor via a third resistor, which control electrode forms one of said input ports to the binary-to-ternary converter via a parallel circuit of a second diode and a second capacitor.

* * * * *